United States Patent
Tuan et al.

(10) Patent No.: US 10,649,267 B2
(45) Date of Patent: May 12, 2020

(54) DISPLAY DEVICE AND MANUFACTURING METHOD THEREOF

(71) Applicant: InnoLux Corporation, Miao-Li County (TW)

(72) Inventors: Hsing-Chien Tuan, Miao-Li County (TW); Chiu-Lien Yang, Miao-Li County (TW); Kuan-Feng Lee, Miao-Li County (TW); Yuan-Lin Wu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 58 days.

(21) Appl. No.: 15/862,652

(22) Filed: Jan. 5, 2018

(65) Prior Publication Data

US 2019/0025620 A1 Jan. 24, 2019

Related U.S. Application Data

(60) Provisional application No. 62/534,232, filed on Jul. 19, 2017.

(51) Int. Cl.
| | |
|---|---|
| *G02F 1/1335* | (2006.01) |
| *G02F 1/136* | (2006.01) |
| *G02F 1/1333* | (2006.01) |
| *G02F 1/1345* | (2006.01) |
| *H01L 27/32* | (2006.01) |
| *H01L 51/00* | (2006.01) |
| *G02F 1/1337* | (2006.01) |
| *H01L 51/52* | (2006.01) |

(52) U.S. Cl.
CPC ............ *G02F 1/1335* (2013.01); *G02F 1/136* (2013.01); *G02F 1/13452* (2013.01); *G02F 1/133305* (2013.01); *G02F 1/1337* (2013.01); *G02F 2001/133331* (2013.01); *G02F 2202/28* (2013.01); *H01L 27/3225* (2013.01); *H01L 51/0097* (2013.01); *H01L 51/524* (2013.01); *H01L 51/5237* (2013.01); *H01L 2251/5338* (2013.01); *H01L 2251/55* (2013.01)

(58) Field of Classification Search
CPC ............ G02F 1/1335; G02F 1/133305; G02F 1/13452; G02F 1/136; G02F 1/1337; G02F 2001/133331; G02F 2202/28; H01L 27/3225; H01L 51/0097; H01L 51/5237; H01L 51/524; H01L 2251/5338; H01L 2251/55

See application file for complete search history.

(56) References Cited

U.S. PATENT DOCUMENTS

| | | | |
|---|---|---|---|
| 9,859,526 B2 | 1/2018 | Lee | |
| 2011/0007391 A1* | 1/2011 | Takahashi | G02F 1/133308 359/485.01 |
| 2014/0049500 A1 | 2/2014 | Chen | |
| 2016/0064466 A1* | 3/2016 | Son | H01L 27/3276 257/40 |

(Continued)

*Primary Examiner* — Nathanael R Briggs
(74) *Attorney, Agent, or Firm* — Winston Hsu

(57) ABSTRACT

A display device includes a flexible layer, a display unit, a cover layer, and an adhesive member. The flexible layer includes a non-bending portion and a bending portion adjacent to the non-bending portion. The display unit is disposed on the flexible layer. The cover layer is disposed on the display unit. The adhesive member is disposed between the non-bending portion of the flexible layer and the cover layer.

13 Claims, 19 Drawing Sheets

(56) References Cited

U.S. PATENT DOCUMENTS

2016/0087024 A1   3/2016  Son
2017/0062741 A1   3/2017  Shin
2017/0076687 A1*  3/2017  Lou .................... H01L 51/5246
2017/0373125 A1  12/2017  Youk

* cited by examiner

DISPLAY DEVICE AND MANUFACTURING METHOD THEREOF

CROSS REFERENCE TO RELATED APPLICATION

This application claims the benefit of U.S. Provisional Patent Application No. 62/534,232, filed on Jul. 19, 2017.

BACKGROUND OF THE DISCLOSURE

1. Field of the Disclosure

The present disclosure relates to a display device and a manufacturing method thereof, and more particularly, to a display device including a flexible layer and a manufacturing method thereof.

2. Background

Because of certain advantages, such as light weight and low volume, flat display panels are widely used in electronic devices, such as mobile phones, televisions, monitors, tablet PCs, and laptop PCs. However, in the conventional flat display panels, conductive lines and driving circuits have to be disposed in non-display peripheral regions of the conventional, the screen-to-body ratio of the electronic device cannot be enhanced, and the borderless design cannot be realized accordingly.

SUMMARY OF THE DISCLOSURE

The present disclosure provides a display device and a manufacturing method thereof. In the display device, a display unit is disposed between a flexible layer and a cover layer, and an adhesive member is disposed between a non-bending portion of the flexible layer and the cover layer. A bending portion of the flexible layer is adjacent to the non-bending portion, and the bending portion of the flexible layer can be used to reduce a border area of the display device for realizing slim border design or borderless design.

A display device is provided in an embodiment of the present disclosure. The display device includes a flexible layer, a display unit, a cover layer, and an adhesive member. The flexible layer includes a non-bending portion and a bending portion adjacent to the non-bending portion. The display unit is disposed on the flexible layer. The cover layer is disposed on the display unit. The adhesive member is disposed between the non-bending portion of the flexible layer and the cover layer.

A manufacturing method of a display device is provided in an embodiment of the present disclosure. The manufacturing method includes the following steps. A flexible layer is formed on a support layer. The flexible layer includes a non-bending portion and a bending portion adjacent to the non-bending portion. The flexible layer is combined with a cover layer by an adhesive member. The adhesive member is located between the non-bending portion of the flexible layer and the cover layer, and a displayer unit is formed between the flexible layer and the cover layer. A cutting process is performed to remove the support layer under the bending portion of the flexible layer. A part of the support layer remains under the non-bending portion of the flexible layer.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIGS. 2-4 are schematic drawings illustrating a manufacturing method of the display device according to the first embodiment of the present disclosure, wherein FIG. 3 is a schematic drawing in a step subsequent to FIG. 2, and FIG. 4 is a top view diagram of FIG. 3.

FIG. 9 and FIG. 10 are schematic drawings illustrating a manufacturing method of a display device according to a sixth embodiment of the present disclosure, wherein FIG. 10 is a schematic drawing in a step subsequent to FIG. 9.

DETAILED DESCRIPTION

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

It will be understood that several embodiments shown below describe different technical features respectively. But these technical features can also be mixed or combined in various ways if they are not conflict to each other.

Figure 1:
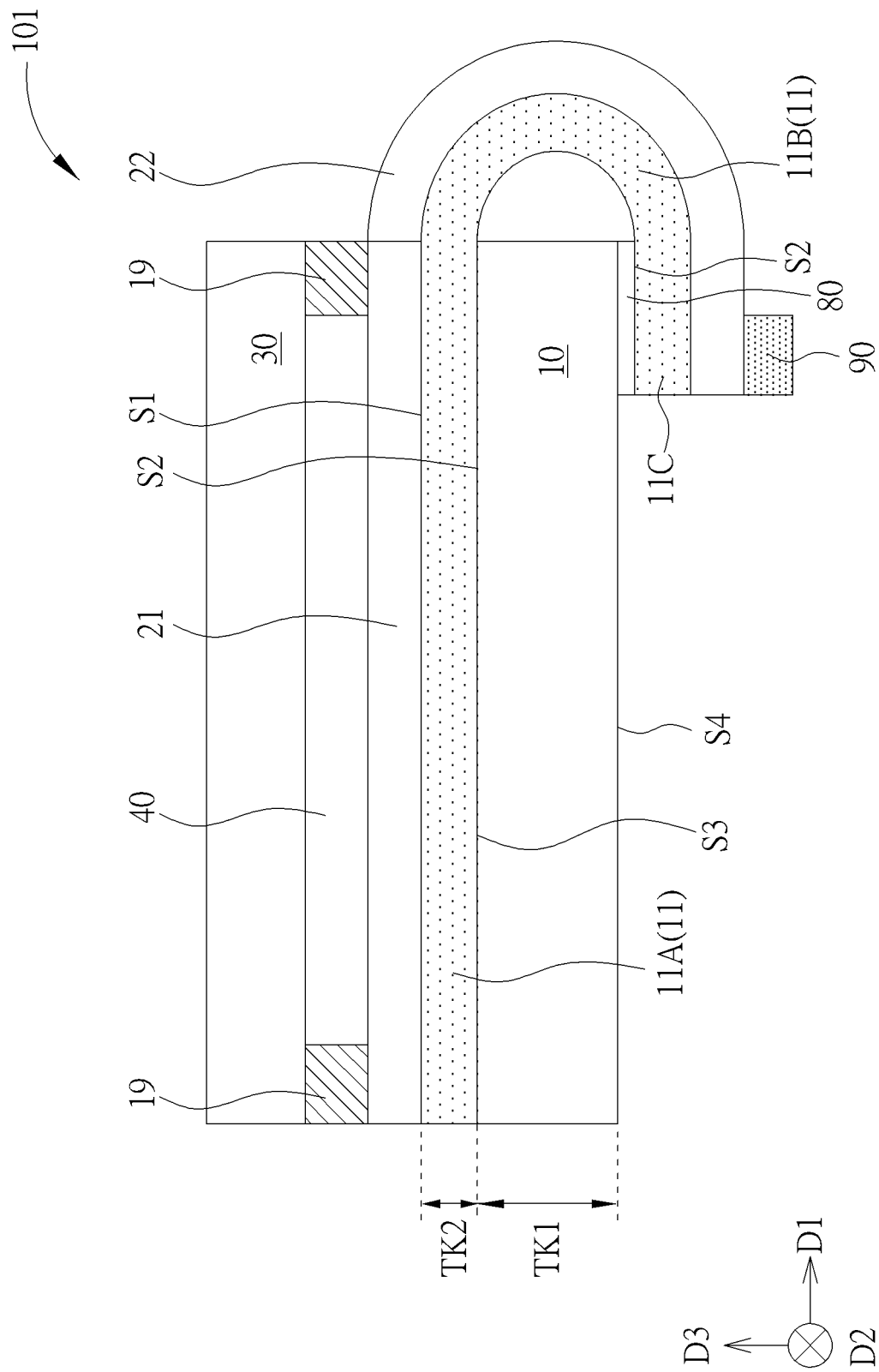
FIG. 1 is a schematic drawing illustrating a display device according to a first embodiment of the present disclosure.

Please refer to FIG. 1. FIG. 1 is a schematic drawing illustrating a display device according to a first embodiment of the present disclosure. As shown in FIG. 1, a display device 101 is provided in this embodiment. The display device 101 includes a flexible layer 11, a display unit 40, a cover layer 30, and an adhesive member 19. In some embodiments, the flexible layer 11 may include a plastic layer such as a polyimide (PI) layer, or a polyethylene terephthalate (PET) layer, or other suitable flexible materials. The flexible layer 11 includes a non-bending portion 11A and a bending portion 11B adjacent to the non-bending portion 11A. The display unit 40 is disposed on the flexible layer 11, the cover layer 30 is disposed on the display unit 40, and the adhesive member 19 is disposed between the non-bending portion 11A of the flexible layer 11 and the cover layer 30. In some embodiments, the display unit 40 may be disposed on the non-bending portion 11A of the flexible layer 11, and the adhesive member 19 may surround the display unit 40, but not limited thereto. The adhesive member 19 may be used to combine the flexible layer 11 with the cover layer 30, and the adhesive member 19 may include a sealant, an optical clear adhesive, encapsulation material, or other suitable adhesive materials. The cover layer 30 may include a transparent layer, such as a glass layer or other suitable transparent materials. The display unit 40 may include a liquid crystal layer, an organic light emitting display (OLED), a light emitting diode (LED), a mini light emitting diode (mini LED), a micro light emitting diode (micro LED), an electro-wetting unit, electrophoretic unit, or other suitable types of display units. It will be understood that the general size of the LED is 300 μm to 10 mm, the mini LED is 100 μm to 300 μm, the micro LED is 1 μm to 100 μm. But the present disclosure is not limited thereto. In some embodiments, the display device 101 may further include a support layer 10 disposed on a side of the flexible layer 11 opposite to another side of the flexible layer 11 on which the display unit 40 is disposed. The support layer 10 may include a relatively rigid layer, such as a glass layer, a quartz layer, a sapphire layer, a stainless steel layer, or other types of rigid layers. Specifically, the support layer 10 has a first young's modulus, the flexible layer 11 has a second young's modulus, and a ratio of the first young's modulus to the second young's modulus is in a range from 10 to 150, but not limited thereto. In other words, the young modulus's of the support layer 10 is higher than the young's modulus of the flexible layer 11. The flexible layer 11 may include a first surface S1 and a second surface S2 opposite to the first surface S1, and the support layer 10 may include a third surface S3 and a fourth surface S4 opposite to the third surface S3 in a thickness direction of the support layer 10 (such as a third direction D3 shown in FIG. 1). The third surface S3 is adjacent to the second surface S2, and the display unit 40 may be disposed on the first surface S1 of the flexible layer 11. In some embodiments, the non-bending portion 11A of the flexible layer 11 may be disposed on the third surface S3 of the support layer 10, and the bending portion 11B of the flexible layer 11 is not directly disposed on the third surface S3 of the support layer 10. In some embodiments, the support layer 10 may have a first thickness TK1, the flexible layer 11 may have a second thickness TK2, and a ratio of the first thickness TK1 to the second thickness TK2 is in a range from 8 to 50, but not limited thereto. In other words, the support layer 10 may be thicker than the flexible layer 11 for providing enough supporting strength, and the flexible layer 11 may be thinner than the support layer 10 for reducing the bending radius of the bending portion 11B.

In some embodiments, the display device 101 may further include a first circuit layer 21 and a second circuit layer 22. The first circuit layer 21 is disposed on the non-bending portion 11A of the flexible layer 11, and the second circuit layer 22 is disposed on the bending portion 11B of the flexible layer 11. In some embodiments, the first circuit layer 21 and the second circuit layer 22 may be formed by the same process, such as an array process, and the second circuit layer 22 may be electrically connected with the first circuit layer 21, but not limited thereto. For example, the first circuit layer 21 may include conductive lines, transistors, capacitors, diodes, and other required components, and the second circuit layer 22 may include conductive lines, bonding pads, or other passive or active components. In some embodiments, the bending portion 11B may include a bonding part 11C disposed on a side of the support layer 10 opposite to another side of the support layer 10 on which the non-bending portion 11A of the flexible layer 11 is disposed. An end of the bending portion 11B may be attached to the fourth surface S4 of the support layer 10 by an adhesive layer 80, but not limited thereto. The adhesive layer 80 may include glue or other suitable adhesive materials. In some embodiments, the second surface S2 of the flexible layer 11 may have a first roughness in the bending portion 11B, the fourth surface S4 of the support layer 10 may have a second roughness, and the first roughness is greater than the second roughness. In this case, one of the advantages is to improve the adhesion between the bonding part 11C and the support layer 10, but not limited thereto. In some embodiments, a treatment may be performed to the second surface S2 of the bonding part 11C before a step of bending the bending portion 11B of the flexible layer 11 and after a step of combining the flexible layer 11 with the cover layer 30 by the adhesive member 19, but not limited thereto. In the embodiments of the present disclosure, the value of the "roughness" of a surface is obtained based on the ten-point height of irregularities (Rz) which is defined as the average distance between the five highest peaks and the five deepest valleys within the evaluation length. In more details, the ten-point height of irregularities (Rz) is calculated according to the following equation:

$$R_z = \frac{1}{5}\sum_{i=1}^{5} R_{pi} - R_{vi},$$

where $R_{pi}$ and $R_{vi}$ are the $i^{th}$ highest peak, and lowest valley respectively.

As shown in FIG. 1, the display device 101 may further include a first circuit unit 90 disposed on the bending portion 11B, and the first circuit unit 90 may be electrically connected with the second circuit layer 22 on the bending portion 11B. The first circuit unit 90 may include a driver integrated circuit (IC), such as a gate driver IC, a source driver IC, a touch sensing driver IC, or other kinds of ICs. In some embodiments, the first circuit unit 90 may be disposed on the bonding part 11C of the bending portion 11B. In this case, one of the advantages is to reduce the border area of the display device 101. In other words, the first circuit unit 90 may be disposed on the side of the support layer 10 opposite to another side of the support layer 10 on which the non-bending portion 11A is disposed. Because the first circuit unit 90 may be disposed on the bending portion 11B of the flexible layer 11 and disposed under the support layer 10, the border area of the display device 101 may be reduced, and slim border design or borderless design may be realized accordingly.

Figure 2:
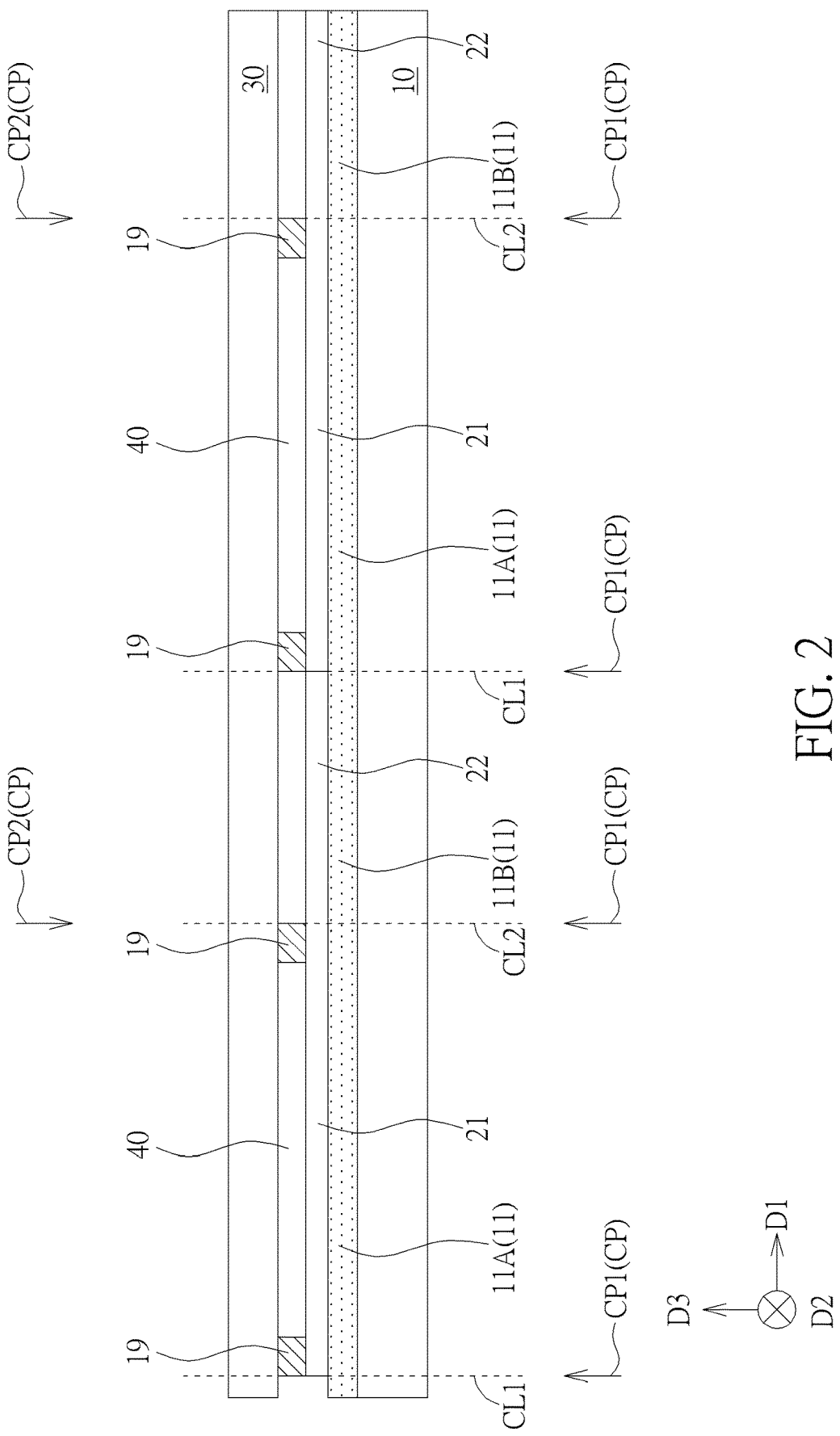
Figure 3:
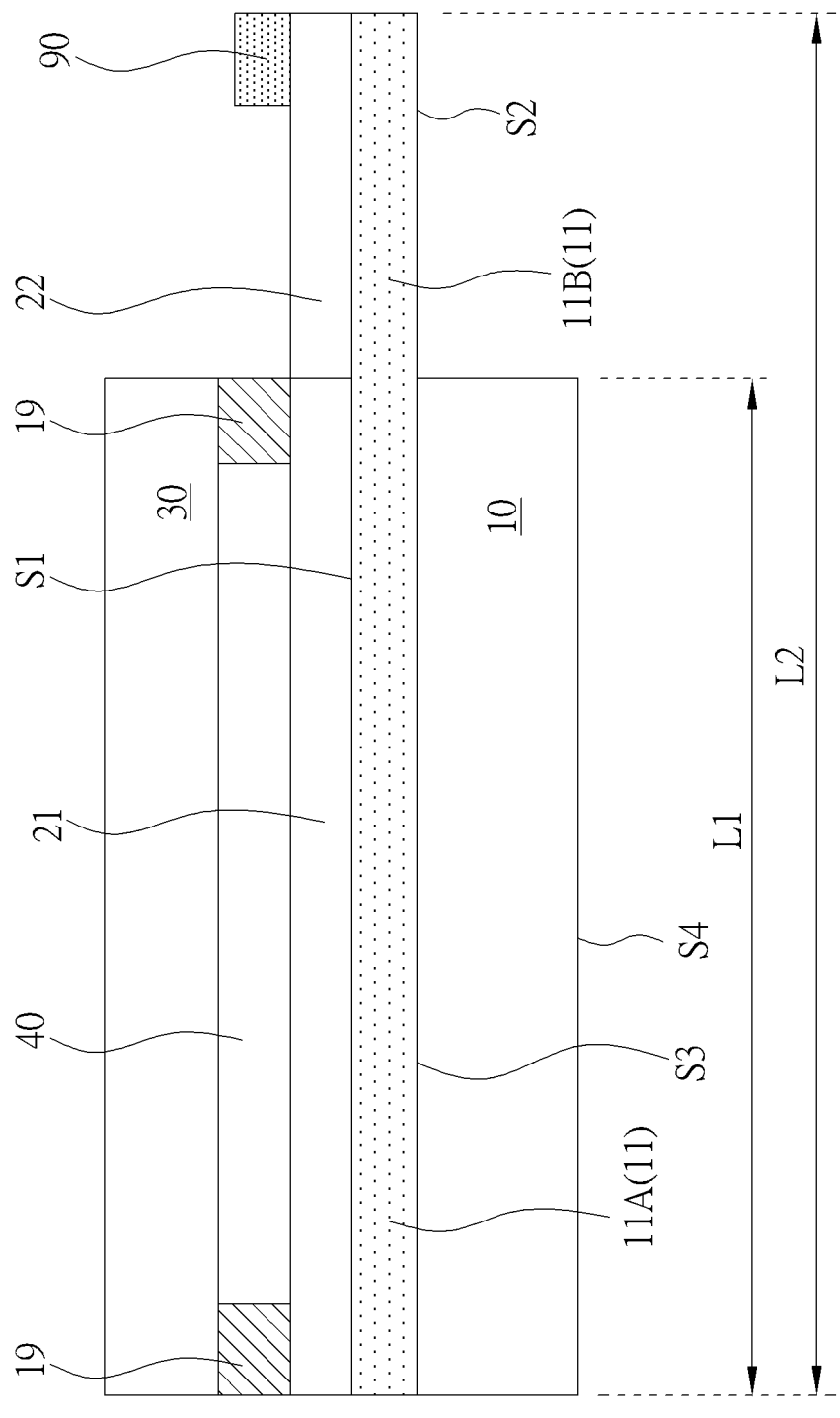
Figure 4:
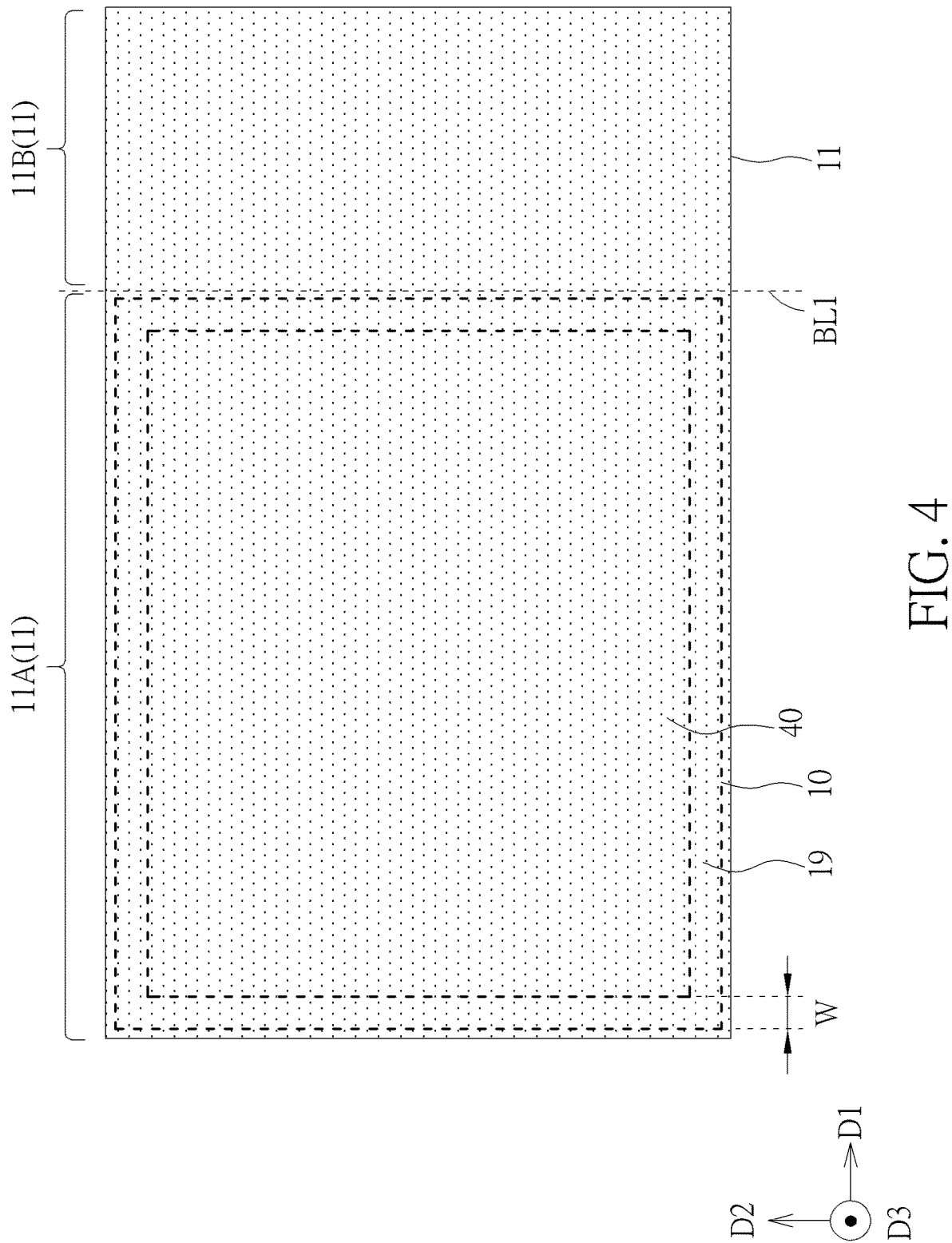

Please refer to FIGS. 1-4. FIGS. 2-4 are schematic drawings illustrating a manufacturing method of the display device 101 according to the first embodiment of the present disclosure. FIG. 3 is a schematic drawing in a step subsequent to FIG. 2, FIG. 4 is a top view diagram of FIG. 3, and FIG. 1 may be regarded as a schematic drawing in a step subsequent to FIG. 3. The manufacturing method of the display device 101 may include but is not limited to the following steps. As shown in FIG. 2, the flexible layer 11 is disposed on the support layer 10, and the flexible layer 11 includes the non-bending portion 11A and the bending portion adjacent 11B to the non-bending portion 11A. In some embodiments, the flexible layer 11 may include a plurality of non-bending portions 11A and a plurality of bending portions 11B alternately disposed in a first direction D1. The flexible layer 11 may be formed on the support layer 10 by an adhesion process, a coating process or other suitable film formation process. The first circuit layer 21 and the second circuit layer 22 may be formed on the flexible layer 11 after the step of forming the flexible layer 11 on the support layer 10. After the step of forming the first circuit layer 21 and the second circuit layer 22, the flexible layer 11 is combined with the cover layer 30 by an adhesive member 19. The adhesive member 19 is located between the non-bending portion 11A of the flexible layer 11 and the cover layer 30, and the displayer unit 40 is formed between the flexible layer 11 and the cover layer 30. Subsequently, as shown in FIG. 2 and FIG. 3, a cutting process CP may be performed to remove the support layer 10 under the bending portion 11B of the flexible layer 11, and a part of the support layer 10 remains under the non-bending portion 11A of the flexible layer 11. Specifically, the cutting process 90 may include a first cutting step CP1 and a second cutting step CP2. The first cutting step CP1 may be performed from a side of the support layer 10 opposite to another side of the support layer 10 on which the flexible layer 11 is disposed, and the second cutting step CP2 may be performed from an outer side of the cover layer 30. The first cutting step CP1 may cut the support layer 10, the flexible layer 11, and the cover layer 30 along a first cutting line CL1, and the first cutting step CP1 may cut the support layer 10 along a second cutting line CL2 without cutting the flexible layer 11 along the second cutting line CL2. The second cutting step CP2 may cut the cover layer 30 along the second cutting line CL2 for removing the cover layer 30 above the bending portion 11B of the flexible layer 11. It is worth noting that the cutting process CP of the present disclosure is not limited to the cutting steps described above and other cutting steps may be applied to remove the support layer 10 under the bending portion 11B of the flexible layer 11. It will be understood that the cutting process CP may be performed by tools such as blade, cutting wheel, laser, or other suitable tools. Or, the cutting process CP may be performed by chemical etching process.

As shown in FIG. 3 and FIG. 4, the support layer 10 has a first length L1 in the first direction D1, and the flexible layer 11 has a second length L2 in the first direction after the cutting process described above. A ratio of the second length L2 to the first length L1 may be greater than 1 and less than or equal to 2, but not limited thereto. Additionally, the support layer 10 has a first area (such as an area of the region marked with 10 in FIG. 4), and the flexible layer 11 has a second area (such as an area of the region marked with 11 in FIG. 4). A ratio of the second area to the first area may be greater than 1 and less than or equal to 2, but not limited thereto. In some embodiments, a width W of the adhesive member 19 may be in a range from 100 micrometers to 2500 micrometers, but not limited thereto.

As shown in FIGS. 2-4 and FIG. 1, the bending portion 11B of the flexible layer 11 is bent after the cutting process CP, and the bending portion 11B may include the bonding part 11C located under the support layer 10 after the step of bending the bending portion 11B of the flexible layer 11. The bonding part 11C of the bending portion 11B may be attached to the fourth surface S4 of the support layer 10 by the adhesive layer 80, but not limited thereto. In some embodiments, the step of bending the bending portion 11B may be performed along a first bending line BL1 shown in FIG. 4, and the first bending line BL1 may extend in a second direction D2 perpendicular to the first direction D1, but not limited thereto. The length of the flexible layer 11 in the first direction D1 is larger than the length of the support layer 10 in the first direction D1 before the step of bending the bending portion 11B of the flexible layer 11. Additionally, in some embodiments, the first circuit unit 90 may be formed on the bending portion 11B after the cutting process CP, and the first circuit unit 90 may be located on the bonding part 11C and under the support layer 10 after the step of bending the bending portion 11B of the flexible layer 11.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 5:
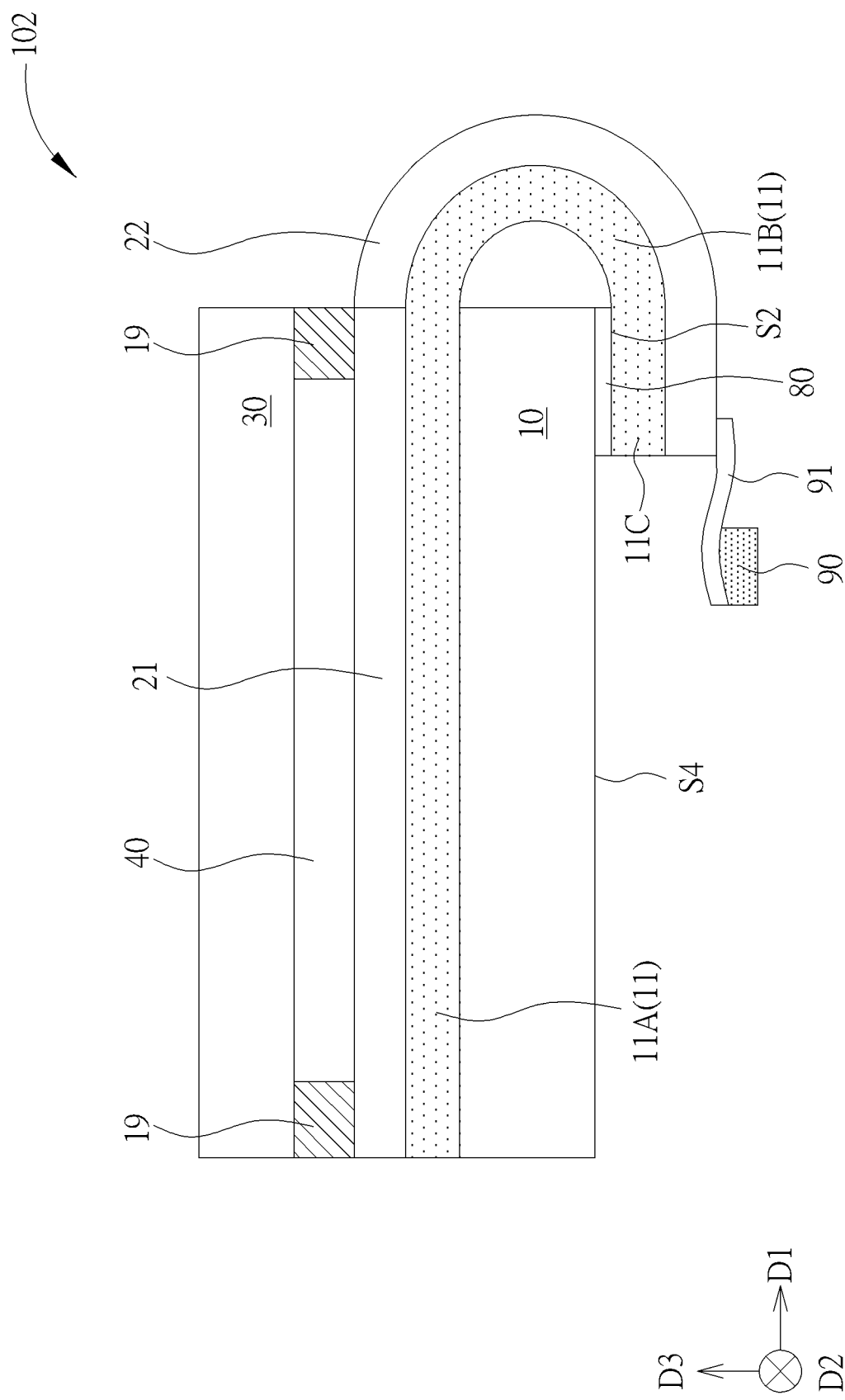
FIG. 5 is a schematic drawing illustrating a display device according to a second embodiment of the present disclosure.

Please refer to FIG. 5. FIG. 5 is a schematic drawing illustrating a display device 102 according to a second embodiment of the present disclosure. As shown in FIG. 5, the display device 102 may further include a first circuit board 91 partly disposed on the bending portion 11B of the flexible layer 11, and the first circuit unit 90 may be disposed on the first circuit board 91. The first circuit unit 90 may be electrically connected with the second circuit layer 22 through the first circuit board 91, and the first circuit board 91 may include a printed circuit board assembly (PCBA) or other suitable types of circuit board.

Figure 6:
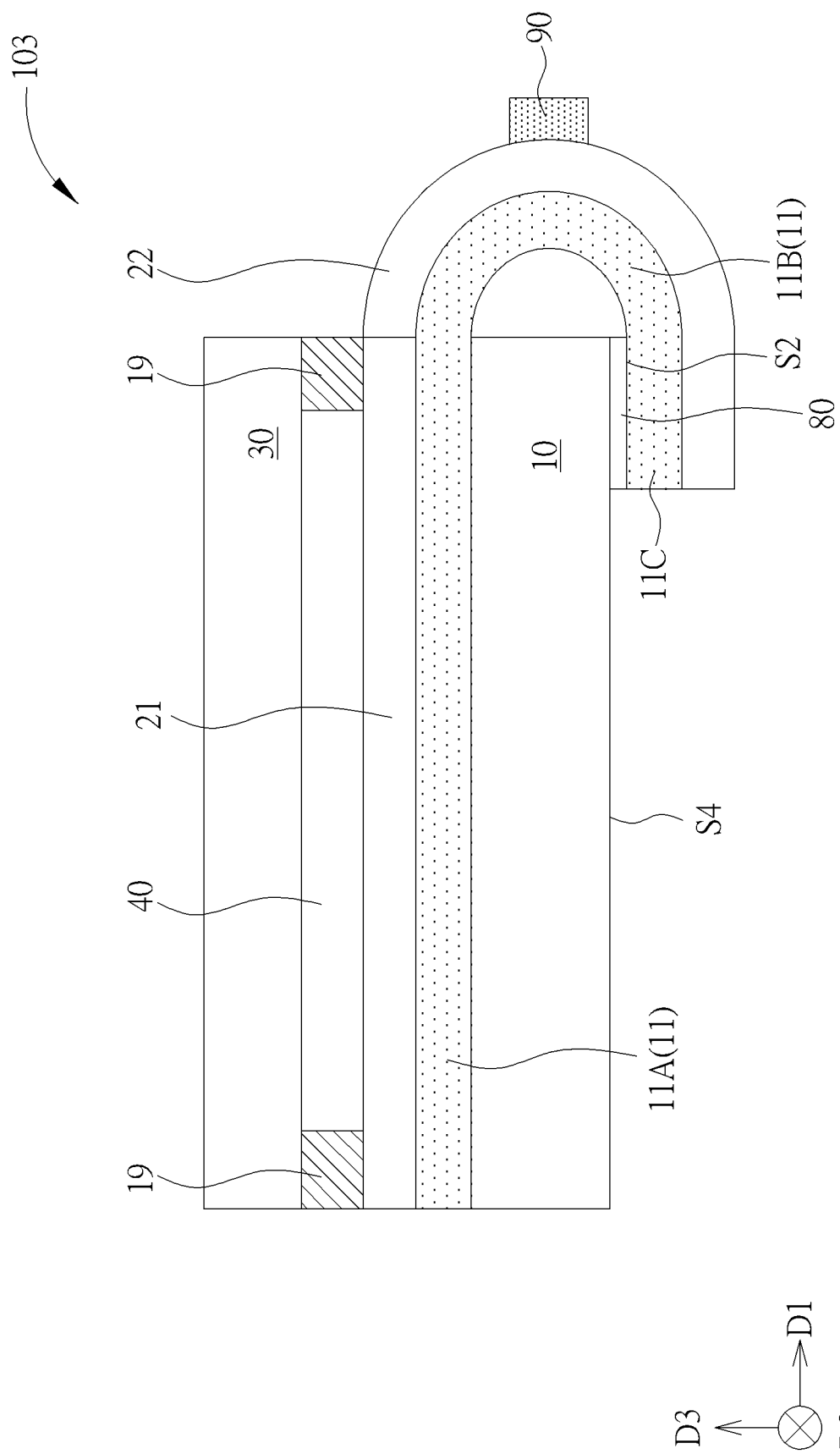
FIG. 6 is a schematic drawing illustrating a display device according to a third embodiment of the present disclosure.

Please refer to FIG. 6. FIG. 6 is a schematic drawing illustrating a display device 103 according to a third embodiment of the present disclosure. As shown in FIG. 6, in the display device 103, the first circuit unit 90 may be disposed on the bending portion 11B of the flexible layer 11, and the first circuit unit 90 may be not disposed on the bonding part 11C of the bending portion 11B. The border area of the display device 102 may be reduced because the bending portion 11B is bent to be partially disposed under the support layer 10 even the first circuit unit 90 is not disposed under the support layer 10.

Figure 7:
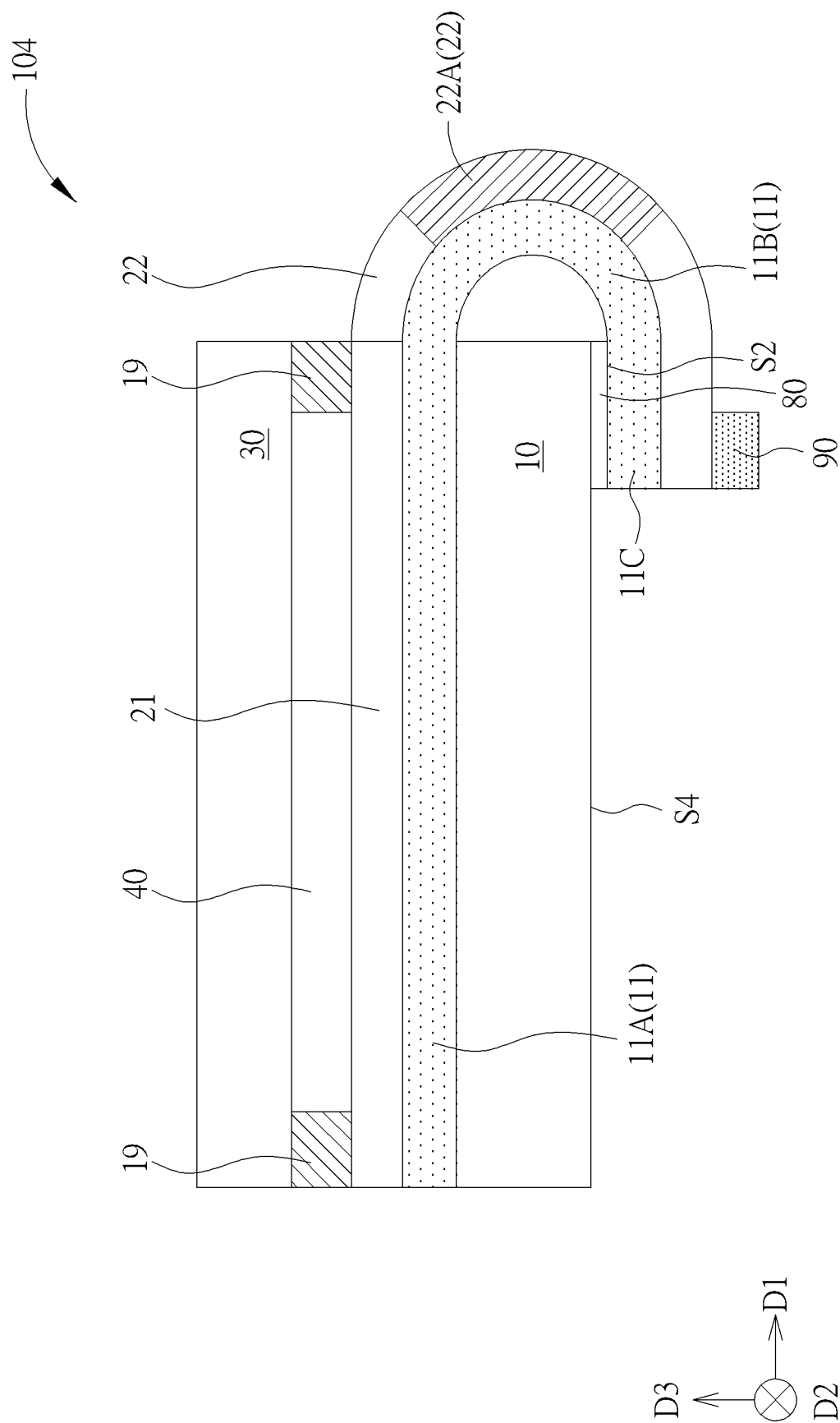
FIG. 7 is a schematic drawing illustrating a display device according to a fourth embodiment of the present disclosure.

Please refer to FIG. 7. FIG. 7 is a schematic drawing illustrating a display device 104 according to a fourth embodiment of the present disclosure. As shown in FIG. 7, in the display device 104, the second circuit layer 22 disposed on the bending portion 11B of the flexible layer 11 may include a second circuit unit 22A, and the second circuit unit 22A may include a gate driving circuit, a demultiplexer (DeMux), or other functional circuit units. In some embodiments, the second circuit unit 22A may be disposed on the bending portion 11B of the flexible layer 11, and the second circuit unit 22A may be not disposed on the bonding part 11C of the bending portion 11B, but not limited thereto. In some embodiments, the gate driving circuit may be disposed within the display area. This type of technic is so called Gate driver in panel (GIP) technic.

Figure 8:
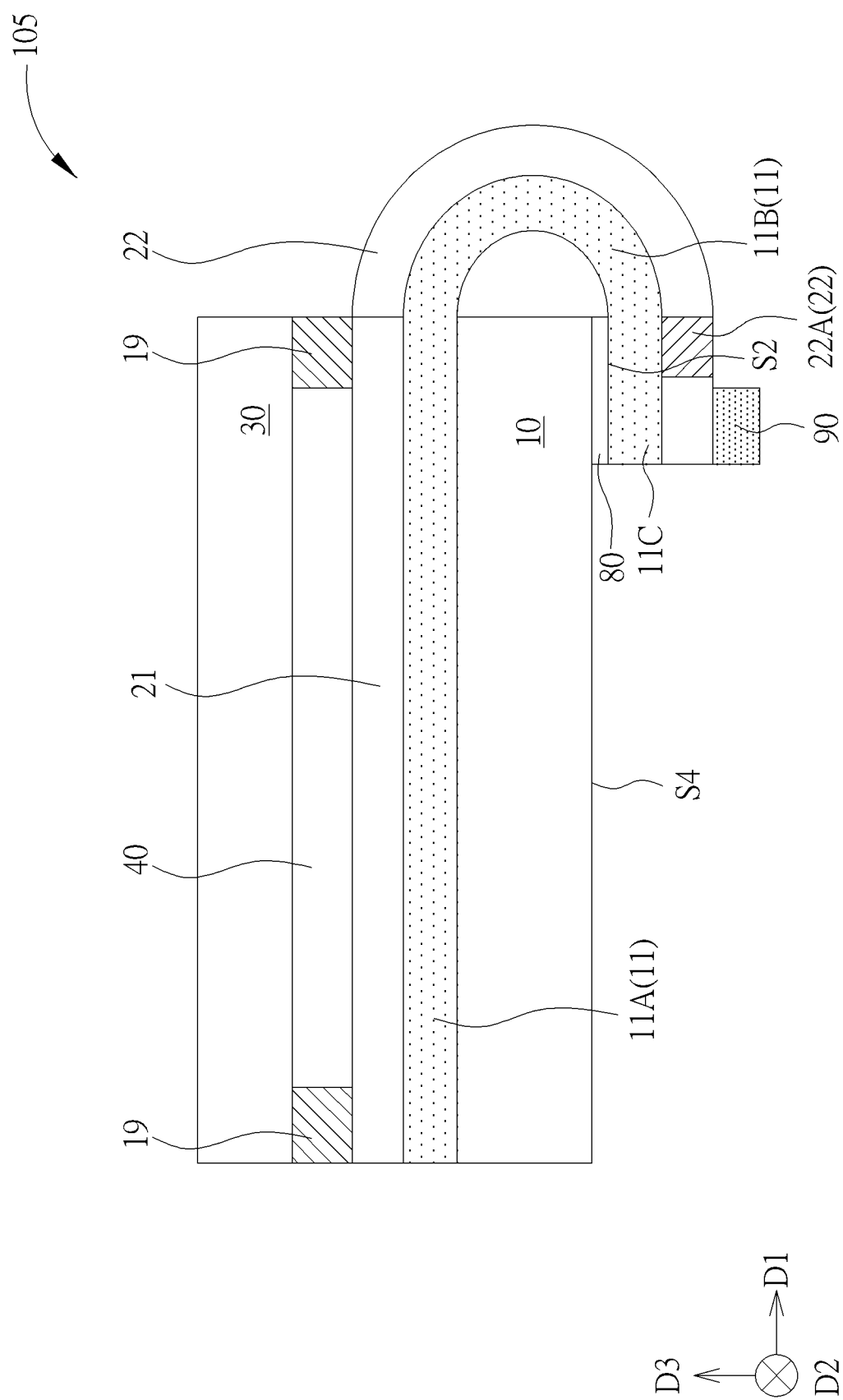
FIG. 8 is a schematic drawing illustrating a display device according to a fifth embodiment of the present disclosure.

Please refer to FIG. 8. FIG. 8 is a schematic drawing illustrating a display device 105 according to a fifth embodiment of the present disclosure. As shown in FIG. 8, in the display device 105, at least a part of the second circuit unit 22A may be disposed on the bonding part 11C. In this case, one of the advantages is to reduce the influence of bending on the second circuit unit 22A.

Figure 9:
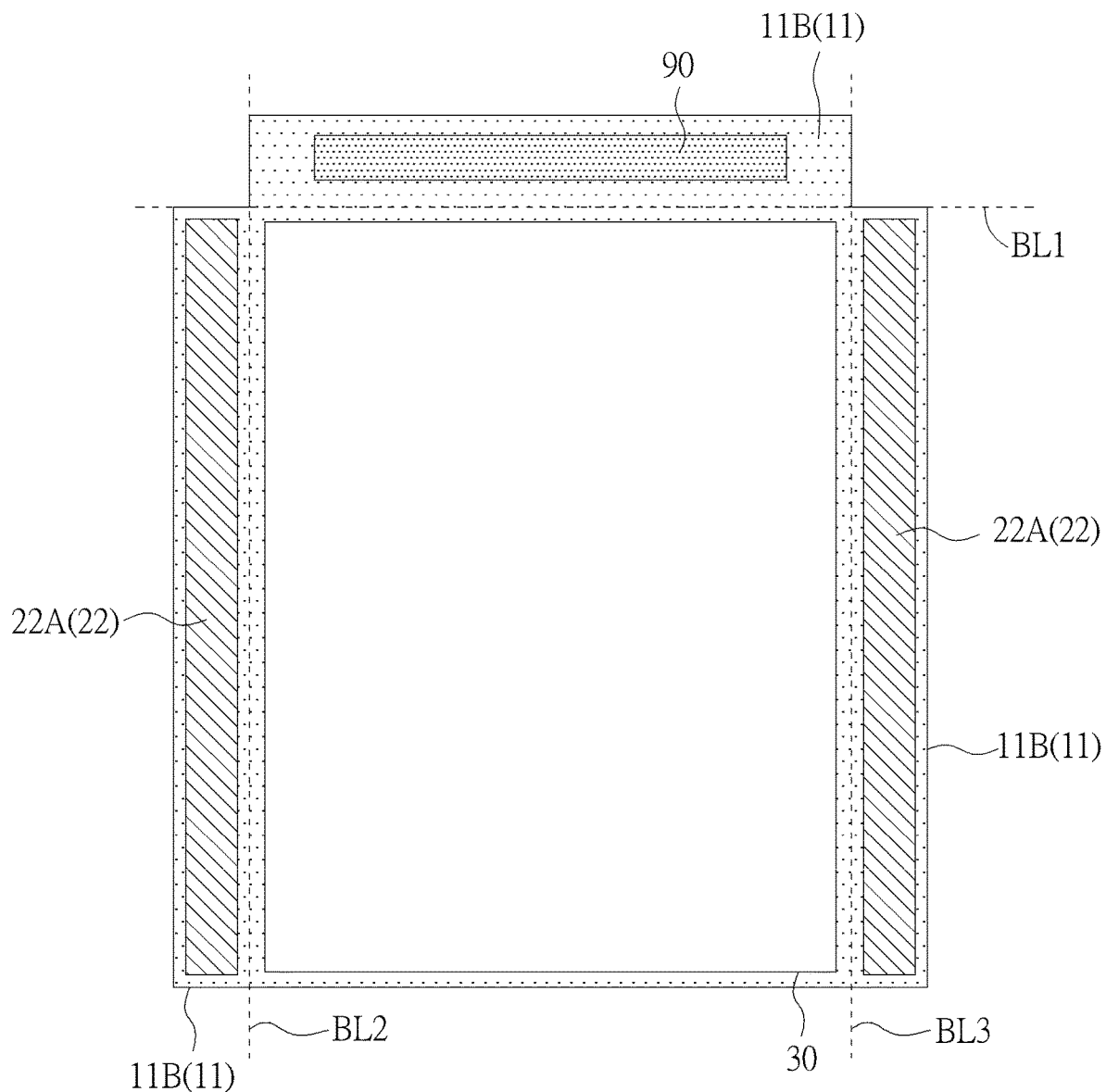
Figure 9:
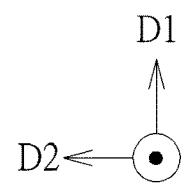
Figure 10:
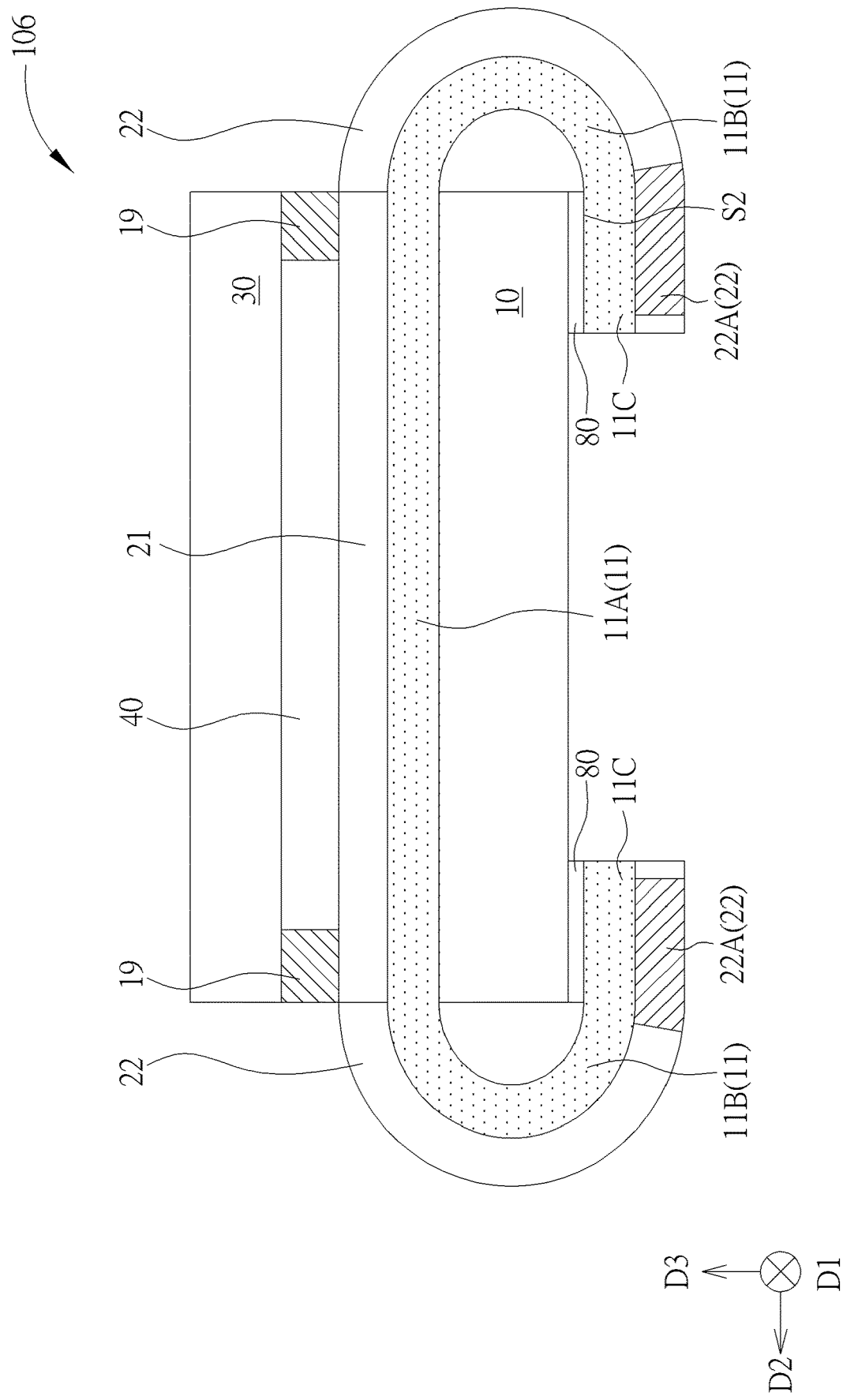

Please refer to FIG. 9 and FIG. 10. FIG. 9 and FIG. 10 are schematic drawings illustrating a manufacturing method of a display device 106 according to a sixth embodiment of the present disclosure, and FIG. 10 is a schematic drawing in a step subsequent to FIG. 9. As shown in FIG. 9 and FIG. 10, the length of the flexible layer 11 may be larger than the length of the support layer 10 in the second direction D2, and a part of the bending portion 11B may be disposed at two opposite sides of the support layer 10 in the second direction D2. The part of the bending portion 11B disposed at the two opposite sides of the support layer 10 in the second direction D2 may be bent along a second bending line BL2 and a third bending line BL3 respectively for being partially disposed under the support layer 10 in the third direction D3. The second bending line BL2 and the third bending line BL3 may extend in the first direction D1 respectively, but not limited thereto. In some embodiments, the second circuit unit 22A may be disposed at the two opposite sides of the support layer 10 in the second direction D2 before the step of bending the bending portion 11B, and the second circuit unit 22A may be at least partially disposed under the support layer 10 after the step of bending the bending portion 11B. The second circuit unit 22A may be a gate driving circuit when the second circuit unit 22A is disposed at the two opposite sides of the support layer 10 in the second direction D2, but not limited thereto.

Figure 11:
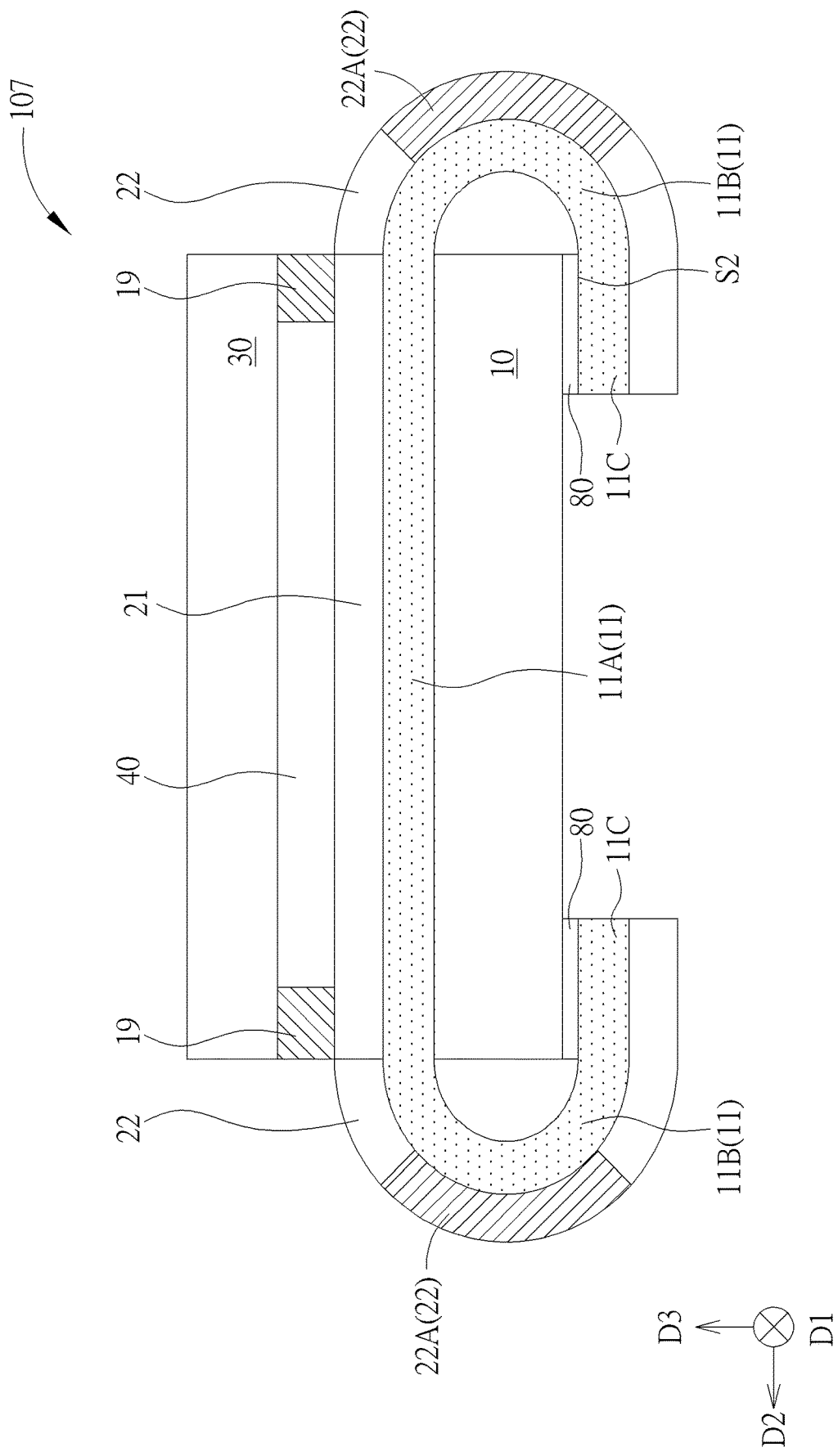
FIG. 11 is a schematic drawing illustrating a display device according to a seventh embodiment of the present disclosure.

Please refer to FIG. 11. FIG. 11 is a schematic drawing illustrating a display device 107 according to a seventh embodiment of the present disclosure. As shown in FIG. 11, in the display device 107, the second circuit unit 22A may be not disposed on the bonding part 11C of the bending portion 11B.

Figure 12:
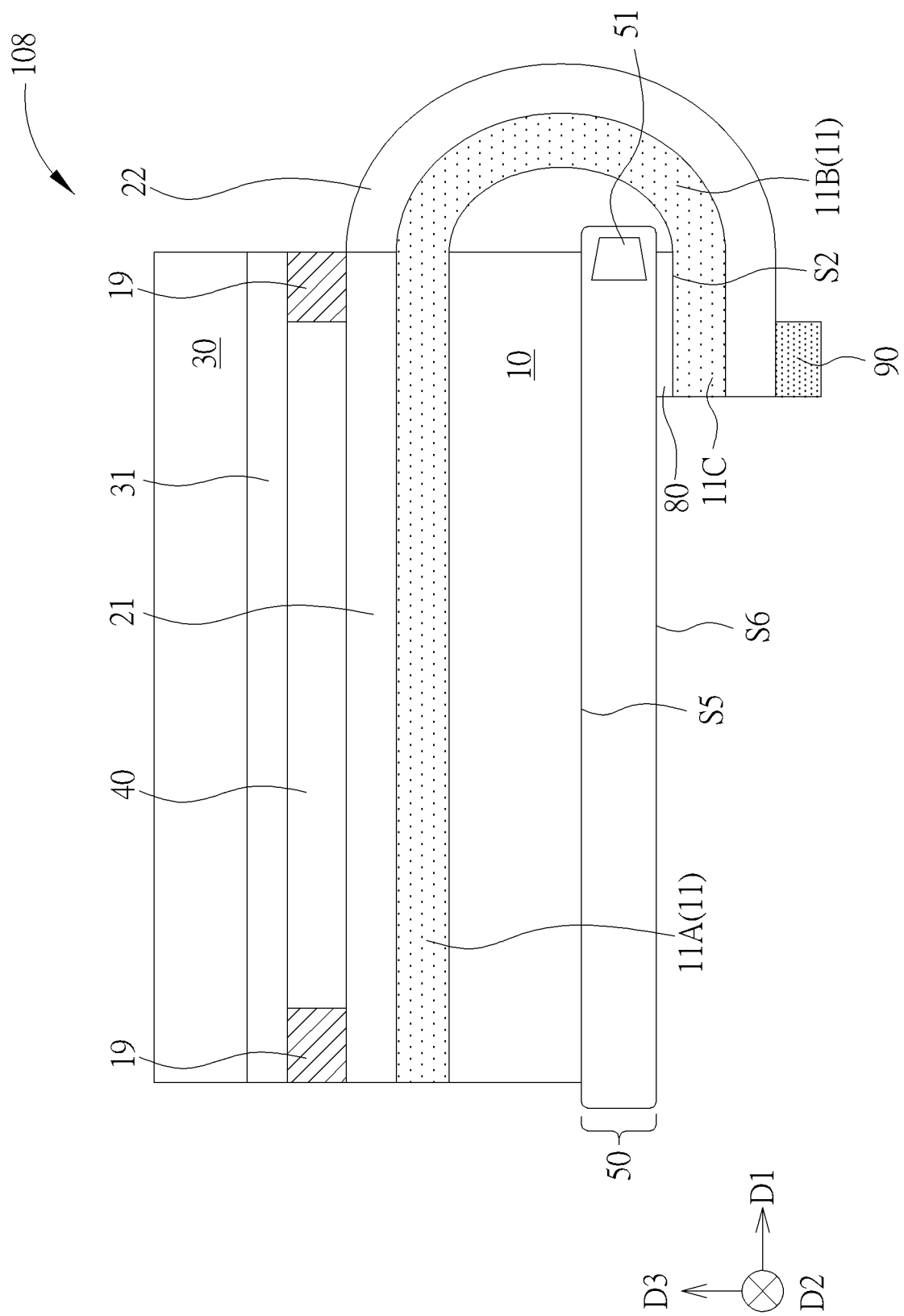
FIG. 12 is a schematic drawing illustrating a display device according to an eighth embodiment of the present disclosure.

Please refer to FIG. 12. FIG. 12 is a schematic drawing illustrating a display device 108 according to an eighth embodiment of the present disclosure. As shown in FIG. 12, the display device 108 may further include a backlight module 50 disposed on the side of the support layer 10 opposite to another side of the support layer 10 on which the non-bending portion 11A of the flexible layer 11 is disposed, and the bonding part 11C of the bending portion 11B may be disposed on a side of the backlight module 50 opposite to another side of the backlight module 50 on which the support layer 10 is disposed. The backlight module 50 may include a fifth surface S5 and a sixth surface S6 opposite to the fifth surface S5 in third direction D3, and the bonding part 11C of the bending portion 11B may be attached to the sixth surface S6 of the backlight module 50 by the adhesive layer 80. A roughness of the second surface S2 of the bending portion 11B may be greater than a roughness of the sixth surface S6 of the backlight module 50. One of the advantages is to improve the adhesion between the bonding part 11C and the backlight module 50, but not limited thereto. In some embodiments, the backlight module 50 may include a light source 51 disposed under the adhesive member 19 in the thickness direction of the support layer 10 (such as the third direction D3 shown in FIG. 12). One of the advantages is to avoid increasing the border area of the display device 108 by the backlight module 50. In some embodiments, the display device 108 may be a liquid crystal display device, and the display device 108 may further include a color filter unit 31 disposed between the cover layer 30 and the flexible layer 11. Additionally, the support layer 10 and the cover layer 30 may be a polarizer respectively when the display device 108 is a liquid crystal display device or other display devices requiring a polarizer. In some embodiments, the display unit 40 may include a common electrode (not shown) disposed on the cover layer 30, a pixel electrode (not shown) disposed on the flexible layer 11, and a liquid crystal layer (not shown) disposed between the common electrode and the pixel electrode, but not limited thereto.

Figure 13:
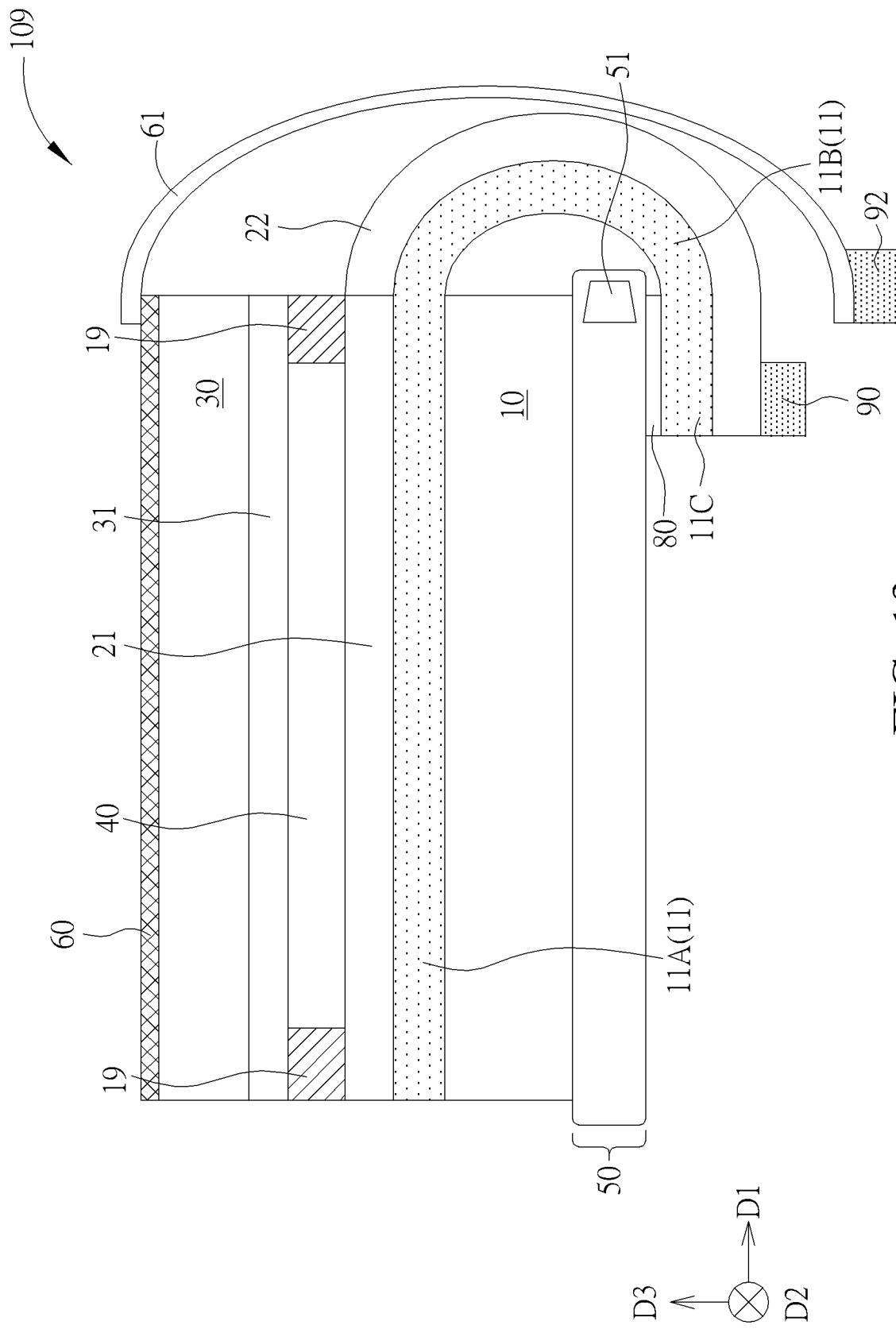
FIG. 13 is a schematic drawing illustrating a display device according to a ninth embodiment of the present disclosure.

Please refer to FIG. 13. FIG. 13 is a schematic drawing illustrating a display device 109 according to a ninth embodiment of the present disclosure. As shown in FIG. 13, the display device 109 may further include a touch sensing unit 60 disposed on the cover layer 30, and the display device 109 may be regarded as a touch on display (TOD) design, but not limited thereto. The touch sensing unit 60 may include a self-capacitance touch sensor, a mutual capacitance touch sensor, a resistance type touch sensor, a force-sensing touch sensor, an optical touch sensor, or other suitable types of touch sensors. A second circuit board 61 may be connected with the touch sensing unit 60, and a third circuit unit 92 may be disposed on the second circuit board 61. In some embodiments, the second circuit board 61 may include a chip on film (COF) structure or other suitable types of circuit board, and the third circuit unit 92 may be a touch sensing driver IC, or other kinds of ICs, but not limited thereto. In other embodiment, the circuit units 90 and 92 may be integrated into one circuit unit. Additionally, the second circuit board 61 may be flexible, and the third circuit unit 92 may be located under the backlight module 50 and the support layer 10. One of the advantages is to reduce the border area of the display device 109.

Figure 14:
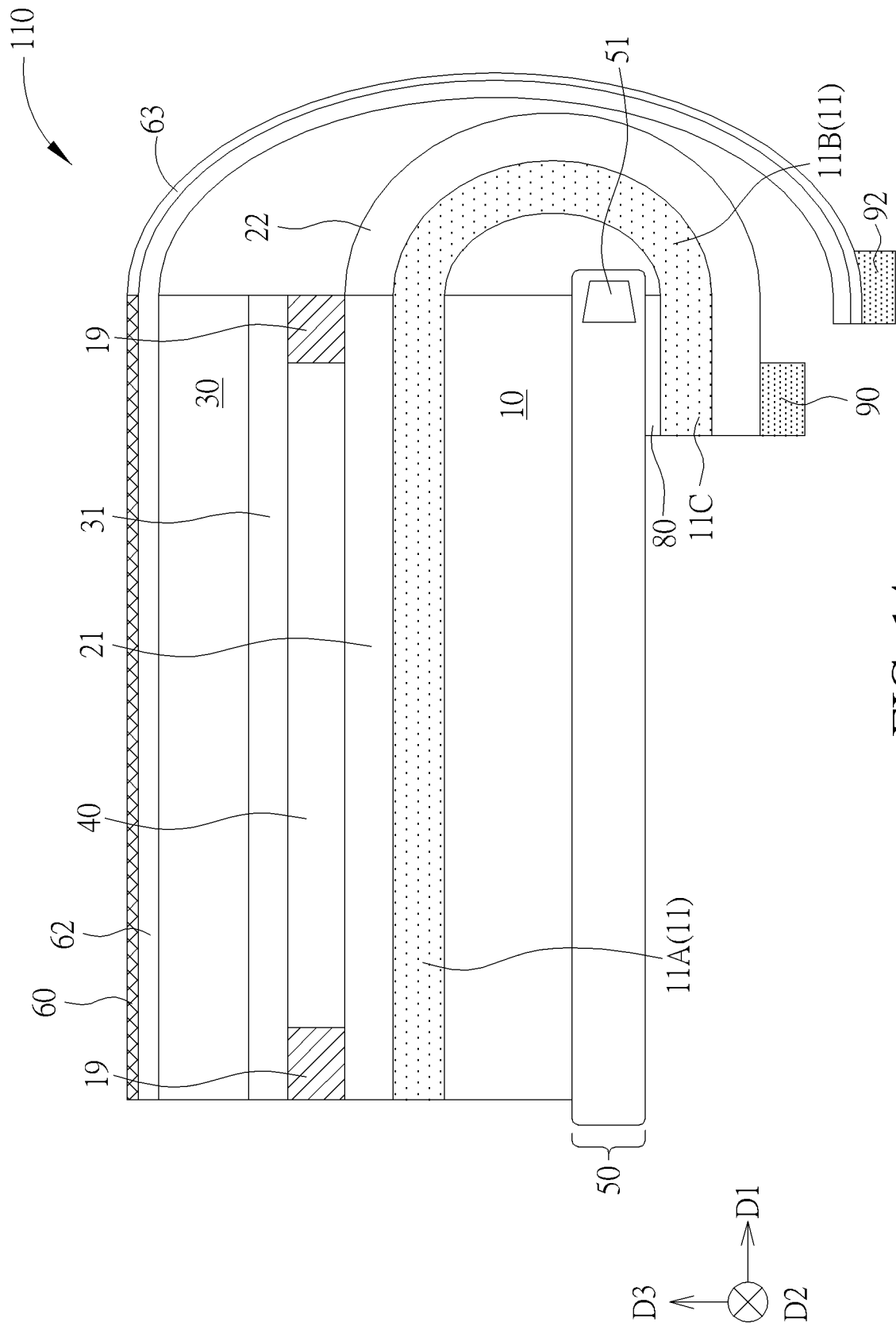
FIG. 14 is a schematic drawing illustrating a display device according to eleventh tenth embodiment of the present disclosure.

Please refer to FIG. 14. FIG. 14 is a schematic drawing illustrating a display device 110 according to eleventh tenth embodiment of the present disclosure. As shown in FIG. 14, the display device 110 may further include a flexible film 62 partly disposed between the touch sensing unit 60 and the cover layer 30 and partly being bent to be partially disposed under the backlight module 50 and the support layer 10. A third circuit layer 63 electrically connected with the touch sensing unit 60 may be disposed on the bending part of the flexible film 62, and the third circuit unit 92 may be disposed on the third circuit unit 63. The flexible film 62 may include a plastic film such as a PI film, or a PET film, or other suitable flexible materials. The third circuit layer 63 may include conductive lines, bonding pads, or other passive or active components. The display device 110 may be regarded as an out cell touch display device, but not limited thereto.

Figure 15:
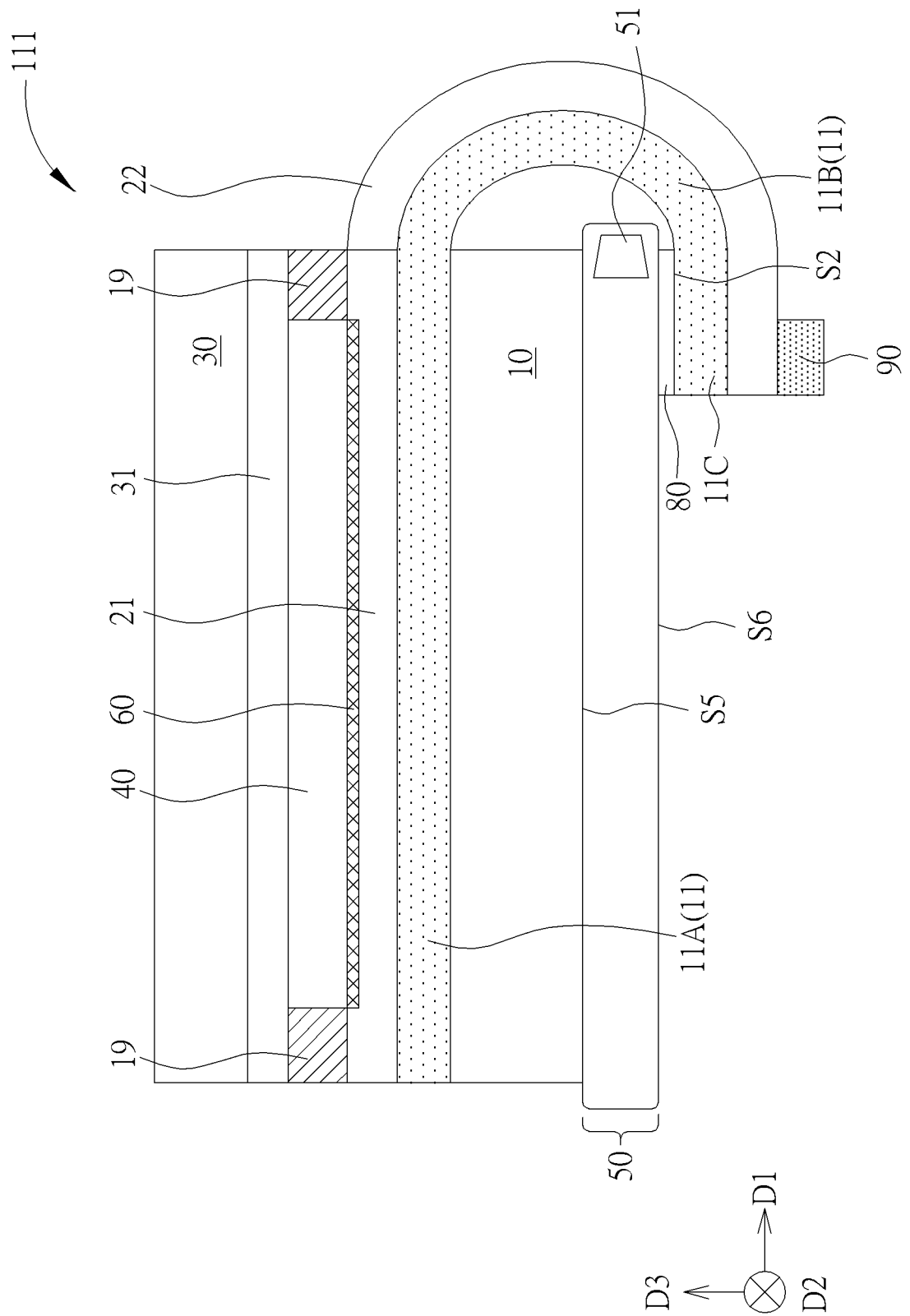
FIG. 15 is a schematic drawing illustrating a display device according to an eleventh embodiment of the present disclosure.

Please refer to FIG. 15. FIG. 15 is a schematic drawing illustrating a display device 111 according to an eleventh embodiment of the present disclosure. As shown in FIG. 15, in the display device 111, the touch sensing unit 60 may be disposed in the first circuit layer 21 on the flexible layer 11. The display device 111 may be regarded as a touch in display design, and the first circuit unit 90 in the display device 111 may be a touch display integrated driver IC, but not limited thereto.

Figure 16:
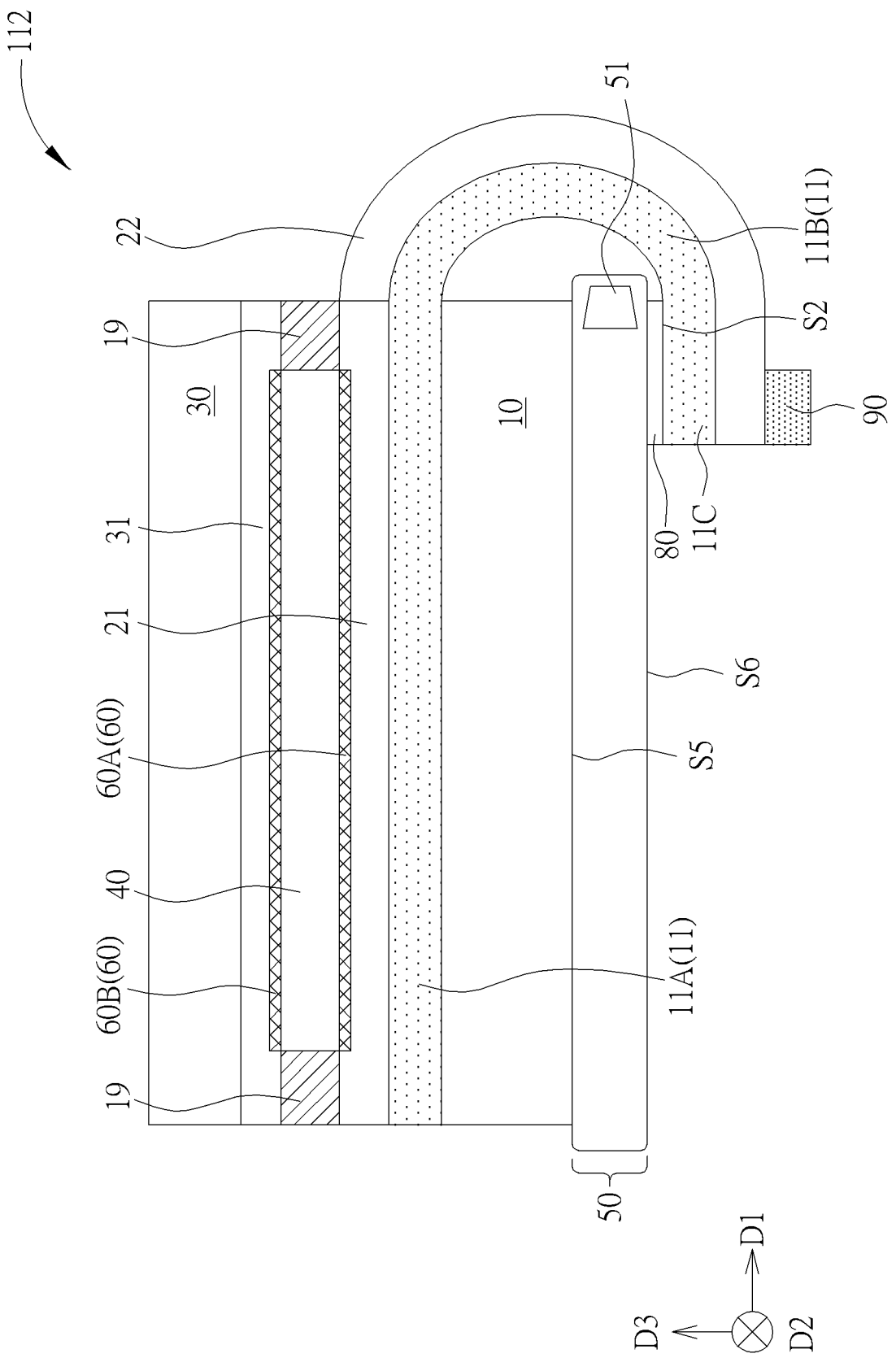
FIG. 16 is a schematic drawing illustrating a display device according to a twelfth embodiment of the present disclosure.

Please refer to FIG. 16. FIG. 16 is a schematic drawing illustrating a display device 112 according to a twelfth embodiment of the present disclosure. As shown in FIG. 16, in the display device 112, the touch sensing unit 60 may include a first touch electrode 60A disposed on the flexible layer 11 and a second touch electrode 60B disposed on the cover layer 30, and the second touch electrode 60B may be electrically connected to the first circuit layer 21 through a connection structure (such as an Au ball, not shown) disposed between the cover layer 30 and the flexible layer 11 in the third direction D3.

Figure 17:
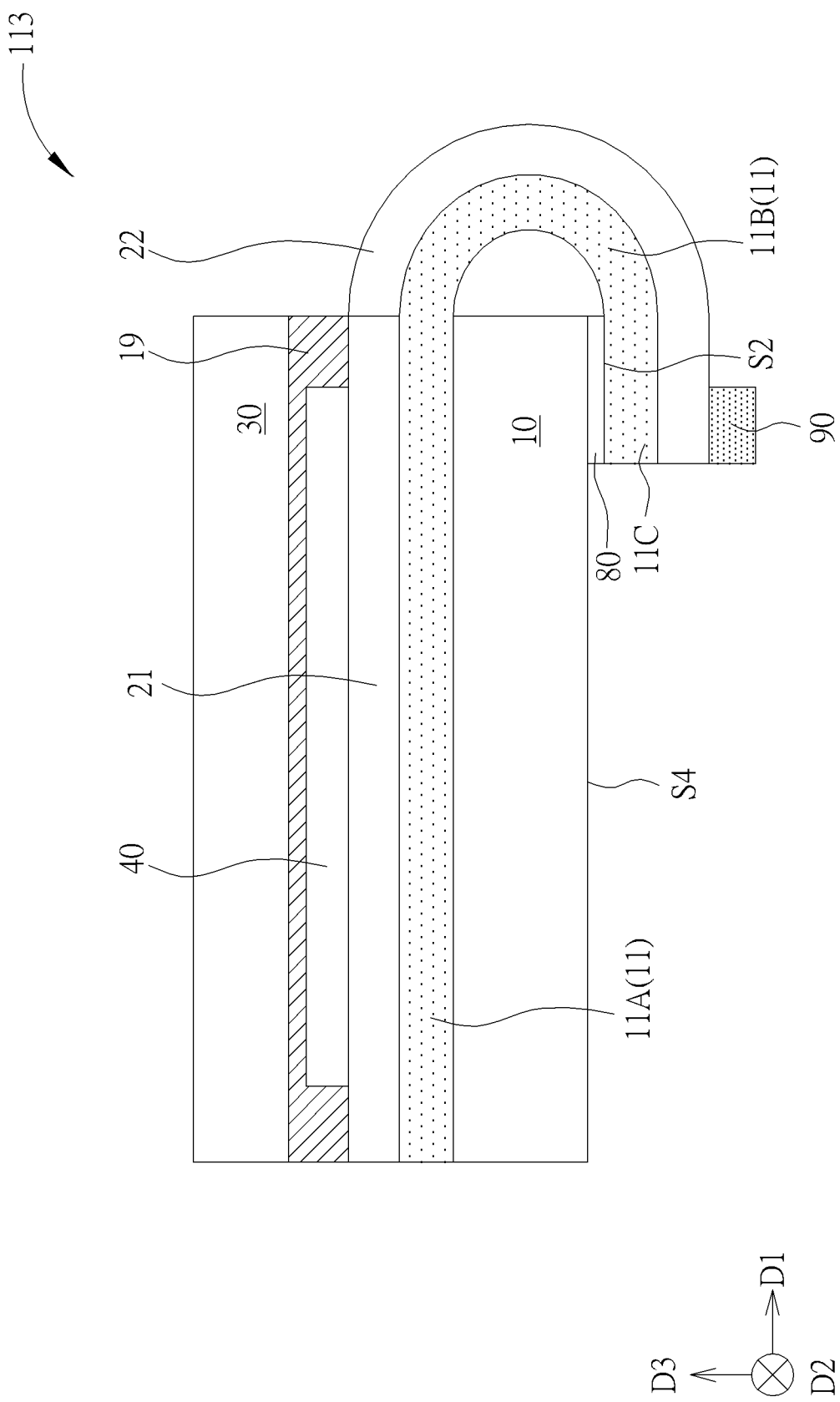
FIG. 17 is a schematic drawing illustrating a display device according to a thirteenth embodiment of the present disclosure.

FIG. 17 is a schematic drawing illustrating a display device 113 according to a thirteenth embodiment of the present disclosure. As shown in FIG. 17, in the display device 113, a portion of the adhesive member 19 may be disposed between the display unit 40 and the cover layer 30 in the third direction D3, and the display unit 40 in the display device 114 may include an OLED display unit or a micro-LED display unit.

Figure 18:
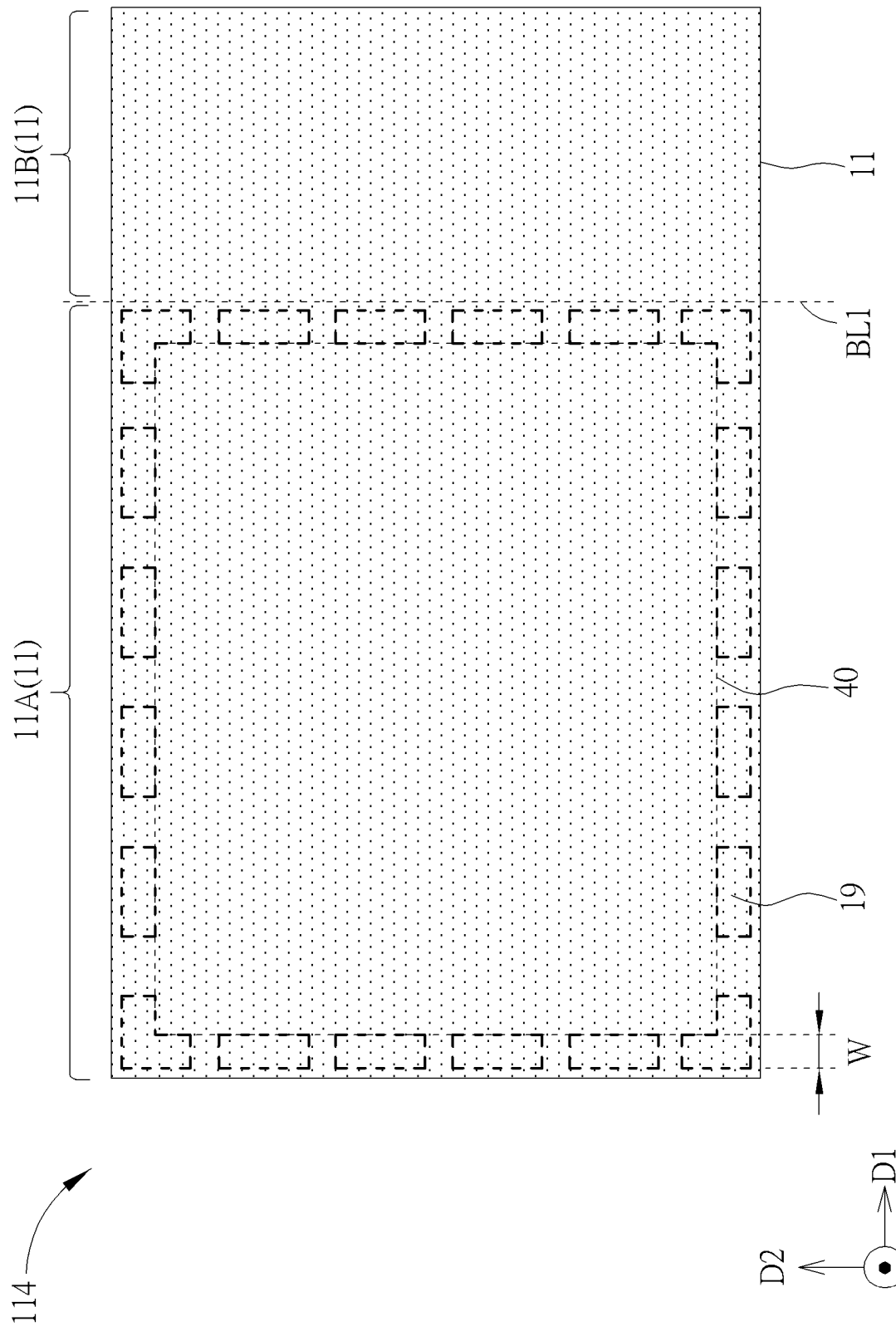
FIG. 18 is a top view diagram illustrating a display device before a step of bending a flexible layer of the display device according to a fourteenth embodiment of the present disclosure.

FIG. 18 is a top view diagram illustrating a display device 114 before the step of bending the flexible layer 11 of the display device 114 according to a fourteenth embodiment of the present disclosure. As shown in FIG. 18, in the display device 114, the display unit 40 may include the structure shown in FIG. 17 described above. In some cases, such as the light emitting diode having been protected by the encapsulation layer, the adhesive member 19 does not completely enclose the display unit 40. In addition, the width W of the adhesive member 19 may also be relatively smaller, and the width W of the adhesive member 19 may be in a range from 100 micrometers to 1000 micrometers, but not limited thereto.

Figure 19:
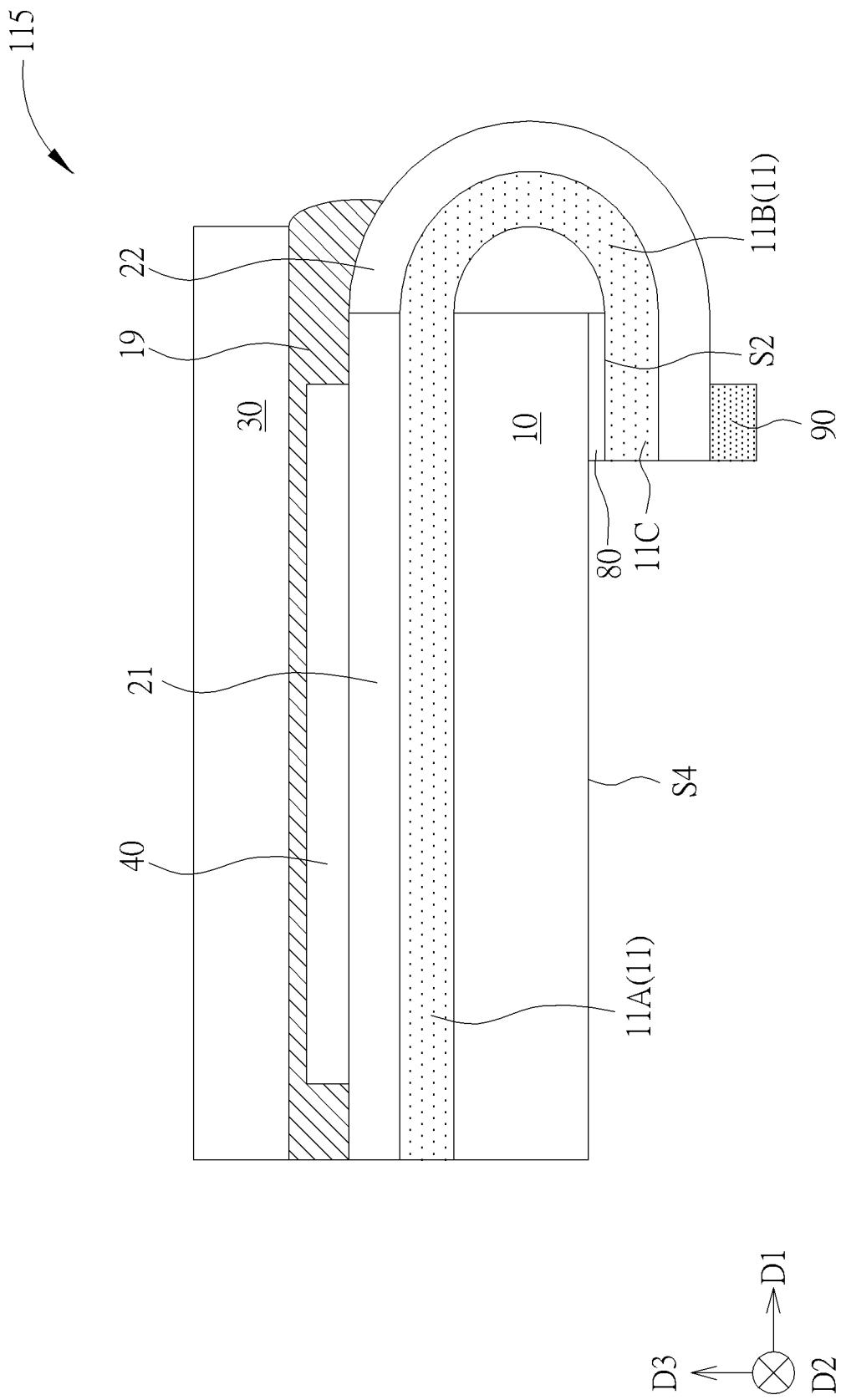
FIG. 19 is a schematic drawing illustrating a display device according to sixteenth fifteenth embodiment of the present disclosure.

Please refer to FIG. 19. FIG. 19 is a schematic drawing illustrating a display device 115 according to a fifteenth embodiment of the present disclosure. As shown in FIG. 19, in the display device 116, the adhesive member 19 may further extend to the bending portion 11B of the flexible layer 11, and a portion of the adhesive member 19 may be disposed between the display unit 40 and the cover layer 30 in the third direction D3. In other words, the adhesive member 19 may extend beyond the first bending line BL1 to be partially disposed on the bending portion 11B of the flexible layer 11. Accordingly, the area of the cover layer 30 may be larger than the area of the support layer 10, and a part of the adhesive member 19 may be disposed between the cover layer 30 and the bending portion 11B of the flexible layer 11.

To summarize the above descriptions, in the display device of the present disclosure, the display unit and the adhesive member are disposed between the non-bending portion of the flexible layer and the cover layer. The bending portion of the flexible layer can be used to reduce the border area of the display device, and the slim border design or the borderless design may be realized accordingly.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
a flexible layer including a non-bending portion and a bending portion adjacent to the non-bending portion;
a display unit disposed on the flexible layer;
a cover layer disposed on the display unit;
an adhesive member disposed between the non-bending portion of the flexible layer and the cover layer, wherein from a top view of the display device, the adhesive member surrounds the display unit but the adhesive member does not cover the display unit;
a support layer disposed on a side of the flexible layer opposite to another side of the flexible layer on which the display unit is disposed, wherein the bending portion comprises a bonding part disposed on a side of the support layer opposite to another side of the support layer on which the non-bending portion of the flexible layer is disposed; and
a backlight module disposed on the side of the support layer opposite to another side of the support layer on which the non-bending portion of the flexible layer is disposed, wherein the bonding part of the bending portion is disposed on a side of the backlight module opposite to another side of the backlight module on which the support layer is disposed.

2. The display device of claim 1, wherein the support layer has a first young's modulus, the flexible layer has a second young's modulus, and a ratio of the first young's modulus to the second young's modulus is in a range from 10 to 150.

3. The display device of claim 1, wherein the support layer has a first thickness, the flexible layer has a second thickness, and a ratio of the first thickness to the second thickness is in a range from 8 to 50.

4. The display device of claim 1, wherein the support layer has a first area, the flexible layer has a second area, and a ratio of the second area to the first area is greater than 1 and less than or equal to 2.

5. The display device of claim 1, wherein the support layer has a first length in a first direction, the flexible layer has a second length in the first direction, and a ratio of the second length to the first length is greater than 1 and less than or equal to 2.

6. The display device of claim 1, wherein the flexible layer includes a first surface and a second surface opposite to the first surface, the support layer includes a third surface and a fourth surface opposite to the third surface, the third surface is adjacent to the second surface, the second surface has a first roughness in the bending portion, the fourth surface has a second roughness, and the first roughness is greater than the second roughness.

7. The display device of claim 1, further comprising:
a first circuit unit disposed on the bonding part of the bending portion.

8. The display device of claim 1, further comprising:
a first circuit layer disposed on the non-bending portion; and
a second circuit layer disposed on the bending portion, wherein the second circuit layer is electrically connected with the first circuit layer.

9. The display device of claim 8, wherein the second circuit layer comprises a second circuit unit, and at least a part of the second circuit unit is disposed on the bonding part.

10. The display device of claim 1, wherein the backlight module comprises a light source disposed under the adhesive member.

11. The display device of claim 1, further comprising:
a first circuit unit disposed on the bending portion.

12. The display device of claim 1, wherein the adhesive member further extends to the bending portion.

13. The display device of claim 1, wherein the display unit comprises a liquid crystal layer, an organic light emitting diode, a light emitting diode, a mini light emitting diode, a micro light emitting diode, an electro-wetting unit, or an electrophoretic unit.

* * * * *